US007519876B2

(12) United States Patent
Oshima

(10) Patent No.: US 7,519,876 B2
(45) Date of Patent: Apr. 14, 2009

(54) MEMORY CARD USING FLASH MEMORY AND METHOD OF CONTROLLING THE SAME

(75) Inventor: Takashi Oshima, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 526 days.

(21) Appl. No.: 11/242,873

(22) Filed: Oct. 5, 2005

(65) Prior Publication Data

US 2007/0005875 A1 Jan. 4, 2007

(30) Foreign Application Priority Data

Jul. 1, 2005 (JP) ............... 2005-193958

(51) Int. Cl.
*G11C 29/44* (2006.01)
*G11C 29/50* (2006.01)
(52) U.S. Cl. ................... 714/710; 714/718
(58) Field of Classification Search .............. None
See application file for complete search history.

(56) References Cited

U.S. PATENT DOCUMENTS

| | | | |
|---|---|---|---|
| 5,517,666 A * | 5/1996 | Ohtani et al. ............ | 712/3 |
| 6,144,607 A * | 11/2000 | Sassa .................... | 365/230.03 |
| 6,188,662 B1 * | 2/2001 | Maeda et al. .......... | 369/83 |
| 6,330,028 B1 * | 12/2001 | Oie et al. .............. | 348/231.1 |
| 6,549,459 B2 * | 4/2003 | Higuchi ................ | 365/185.09 |
| 2001/0036109 A1 | 11/2001 | Jha et al. | |
| 2002/0067640 A1 * | 6/2002 | Pascucci ............... | 365/185.11 |
| 2003/0014582 A1 | 1/2003 | Nakanishi | |
| 2004/0032789 A1 | 2/2004 | Ngo et al. | |
| 2004/0190406 A1 * | 9/2004 | Hwang et al. ......... | 369/47.1 |
| 2004/0246850 A1 * | 12/2004 | Park et al. ............ | 369/53.15 |
| 2006/0271729 A1 | 11/2006 | Oshima et al. | |
| 2007/0005875 A1 | 1/2007 | Oshima et al. | |

FOREIGN PATENT DOCUMENTS

JP 9-198884 7/1997
WO WO 2006/009322 A2 1/2006

* cited by examiner

*Primary Examiner*—Cynthia Britt
*Assistant Examiner*—Dipakkumar Gandhi
(74) *Attorney, Agent, or Firm*—Oblon, Spivak, McClelland, Maier & Neustadt, P.C.

(57) ABSTRACT

There is disclosed a memory having a plurality of blocks including management information, and a centralized management block in which the management information of each block is centralized, wherein a control section detects the centralized management block in the memory at a starting time, and searches for the management information from the plurality of blocks in the memory, and writes the searched management information into the centralized management block of the memory, within a restricted time set in a system in a case where the centralized management block includes an error.

20 Claims, 12 Drawing Sheets

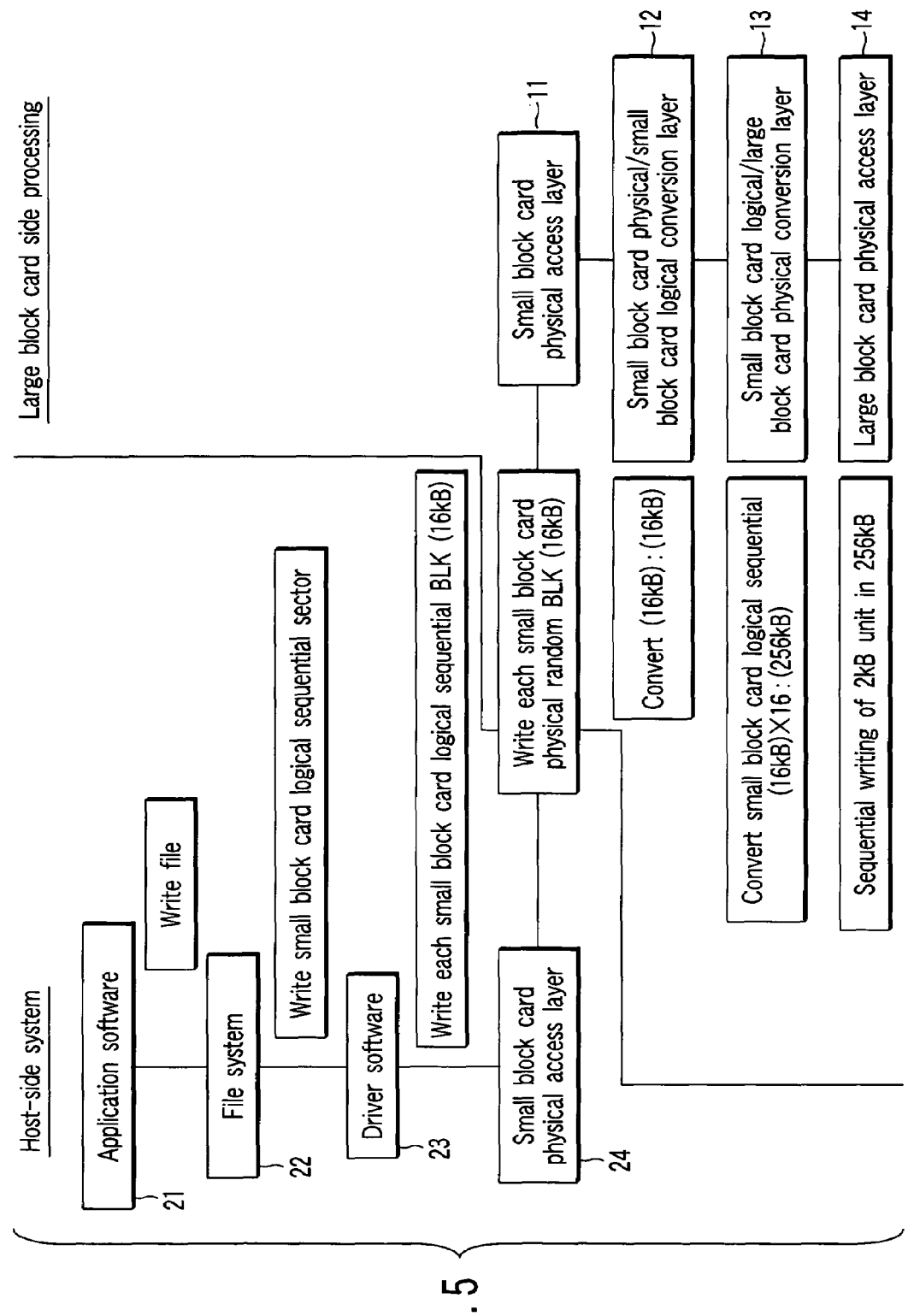
F I G. 5

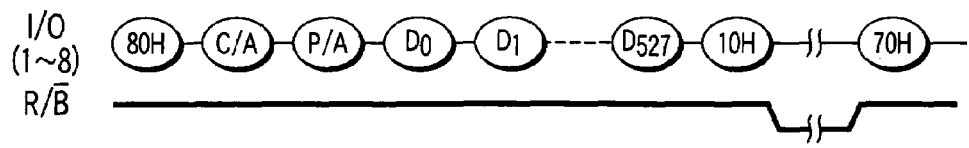
F I G. 10
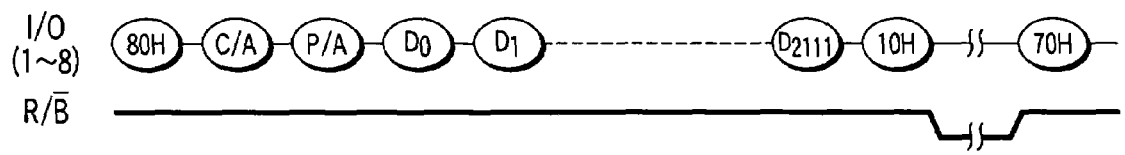
F I G. 11
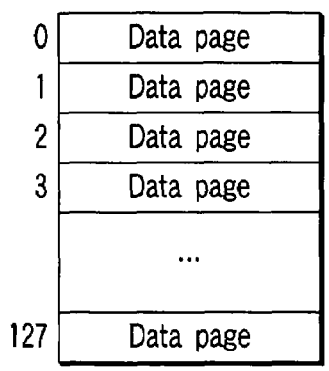
Data block
F I G. 12A
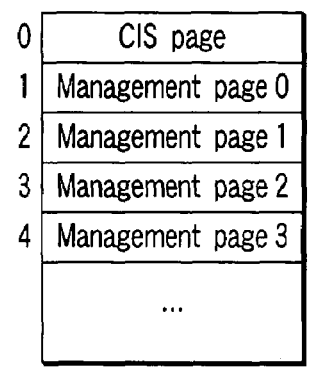
Centralized management block
F I G. 12B

| | Description | | Bytes |
|---|---|---|---|
| CIS | CIS data | | 512B |
| CIS-PBA | Hold xPBA of CIS | | 2B(10bit) |
| Identification No. | Identification number  Return signature region at fixed AA55h at reading | | 512B |
| ID | Type and bad BLK attribute of data written in page | | 1B |
| | bit7-6 | BLK Status | |
| | | 0x00  Bad Block | |
| | | 0x01  Pair BLK, Reserved pair BLK | |
| | | 0x10  Spare's spare BLK | |
| | | 0x11  Logical assigned BLK, Spare BLK | |
| | bit5-0 | BLK ID | |
| Vacant BLK | Store PBA of arbitrary 8 erased BLK | | 13B(8x13bit) |
| ECC | ECC with respect to column addresses 0 to 517, 528 to 1045, 1056 to 1573, 1584 to 2101 | | 10B |
| Assign &Status | Represent zone to which 1 BLK is assigned at 1 byte and status of the BLK  Hold in order from lower PBA.  Since management BLK is not rewritten for each erased BLK, there is possibility that BLK has been erased although BLK is assigned to any zone | | 8192B |
| | bit7-6 | Same as status ID of BLK | |
| | bit5-0 | Upper 6 bits of zone number (7 bits) of data stored in BLK | |

FIG. 14

MEMORY CARD USING FLASH MEMORY AND METHOD OF CONTROLLING THE SAME

CROSS-REFERENCE TO RELATED APPLICATIONS

This application is based upon and claims the benefit of priority from prior Japanese Patent Application No. 2005-193958, filed Jul. 1, 2005, the entire contents of which are incorporated herein by reference.

BACKGROUND OF THE INVENTION

1. Field of the Invention

The present invention relates to a memory card using, for example, a NAND flash memory, and a method of controlling the memory card at a starting time.

2. Description of the Related Art

In a system in which a NAND flash memory is used, data of each block in the memory needs to be scanned at a system starting time to obtain various types of information. This information includes information on whether or not the block is a block (hereinafter referred to as the bad block) having an error or whether or not the block is a vacant block, information indicating a logical block address of written data and the like. However, in recent years, a technology has been considered in which a centralized management block to manage this information in a centralized manner is disposed in the memory, and various types of information in all the blocks in the memory are written together beforehand in this centralized management block (see, e.g., Jpn. Pat. Appln. KOKAI Publication No. 9-198884).

When this centralized management block is disposed, the centralized management block is detected at the starting time, and the data is read from this centralized management block. Consequently, it is possible to obtain the information of the whole memory without scanning all the blocks in the memory.

However, when an uncorrectable error is generated at the time of reading the centralized management block, and the information of the centralized management block cannot be read, it is impossible to start the system. In this case, it is difficult to use the memory card, although most of the blocks are normal. This is therefore very inconvenient for a user. Therefore, there has been a demand for a memory card in which the system can be securely started even in a case where there is an error in the centralized management block, and a method of controlling the card.

BRIEF SUMMARY OF THE INVENTION

According to a first aspect of the present invention, there is provided a memory card comprising: a memory having a plurality of blocks including management information, and a centralized management block in which the management information of the respective blocks is centralized; and a control section which detects the centralized management block in the memory at a starting time and which searches for the management information from the plurality of blocks in the memory and writes the searched management information into the centralized management block of the memory, within a restricted time set in a system in a case where the centralized management block includes an error.

According to a second aspect of the present invention, there is provided a method of controlling a memory card, comprising: detecting a centralized management block in a memory at a starting time; searching for management information from a plurality of blocks in the memory within a restricted time set in a system in a case where the centralized management block includes an error; and writing the searched management information into the centralized management block of the memory.

According to a third aspect of the present invention, there is provided a method of controlling a memory card, comprising: detecting a centralized management block in a memory at a starting time; searching for management information from a plurality of blocks in the memory within a restricted time set in a system in a case where the detected centralized management block includes an error; writing the searched management information into the centralized management block of the memory; judging whether or not the management information of all of the blocks is recorded in the centralized management block in a case where the detected centralized management block does not include any error; and searching for the management information from the remaining blocks of the memory, and writing the plurality of pieces of searched management information into the centralized management block in the memory for a time which is shorter than the restricted time in a case where the management information of all of the blocks is not recorded.

BRIEF DESCRIPTION OF THE SEVERAL VIEWS OF THE DRAWING

FIG. 5 is a diagram showing communication hierarchies of a host-side system and the memory card;

FIG. 10 is a timing chart showing an example of signals at a time when data is written into the memory card of the present embodiment by the host apparatus;

FIG. 11 is a timing chart showing an example of signals at a time when the data is written into the flash memory in the memory card of the present embodiment by a controller in the memory card;

FIGS. 12A, 12B are diagrams showing schematic constitutions of a data block and a centralized management block in the flash memory;

FIG. 14 is an explanatory view concerning major information shown in FIG. 13;

DETAILED DESCRIPTION OF THE INVENTION

An embodiment of the present invention will be described hereinafter with reference to the drawings.

Figure 2:
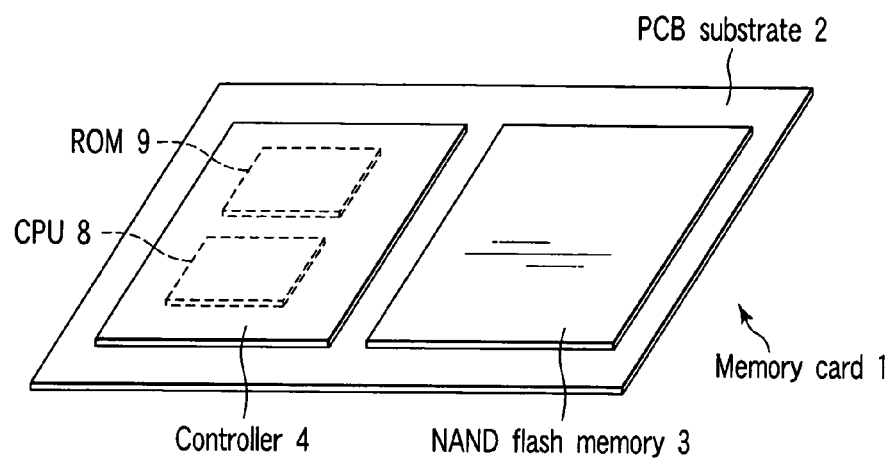
FIG. 2 is a perspective view showing schematic constitutions of devices mounted on a memory card according to the embodiment of the present invention.

FIG. 2 is a perspective view showing schematic constitutions of devices mounted on a memory card according to the embodiment of the present invention.

A memory card 1 comprises: a printed circuit board (PCB) substrate 2; and a NAND flash memory 3 and a controller 4 disposed on this printed circuit board (PCB) substrate 2. The controller 4 has functional blocks such as a central processing unit (CPU) 8 and a read-only memory (ROM) 9. Details of devices will be described later in detail. It is to be noted that the NAND flash memory 3 may be a binary memory which stores one bit of information in one memory cell, or a multi-valued memory which stores in one memory cell information (e.g., two bits) more than one bit. FIG. 2 shows a case where the NAND flash memory 3 and the controller 4 are disposed on the PCB substrate 2, but the NAND flash memory 3 and the controller 4 may be disposed on the same large-scale integration (LSI) substrate.

The terms "logical block address" and "physical block address" for use in the following description mean a logical address and a physical address of a block itself. The "logical address" and "physical address" mainly mean the logical address and the physical address of the block itself, but it is indicated that the address sometimes corresponds to a unit of a resolution which is finer than a block unit.

Figure 3:
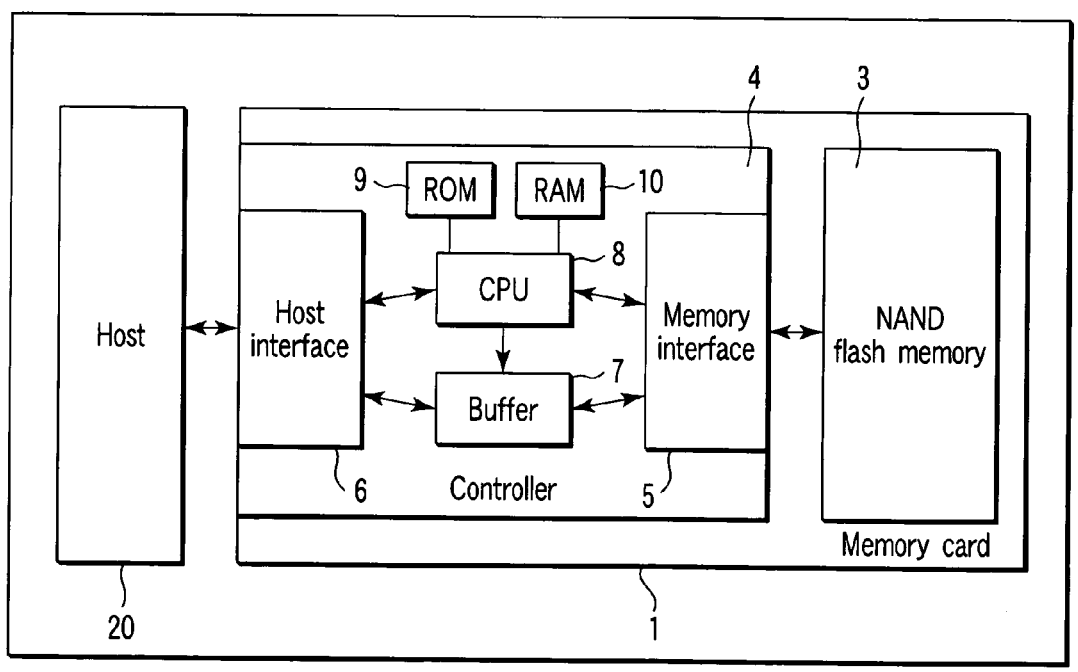
FIG. 3 is a block diagram showing a constitution including a host apparatus and the memory card shown in FIG. 2.

FIG. 3 is a block diagram showing a constitution including a host and the memory card. In FIG. 3, the same components as those of FIG. 2 are denoted with the same reference numerals.

A host apparatus (hereinafter referred to as the host) 20 is provided with hardware and software (system) for accessing the memory card to be connected. This host 20 manages a physical state (physical block address in which logical sector address data is included, and ordinal number of the data, or block in an erased state) inside the memory card, and directly controls a flash memory inside the memory card.

Moreover, it is assumed in the host 20 that the NAND flash memory is used in which an erased block size at an erasing time is set to 16 Kbytes. The logical/physical address is assigned to a unit of 16 Kbytes. In many cases, the logical address of 16 Kbytes is sequentially accessed and written or read (corresponding command is issued).

The memory card 1 receives a power supply to operate, when connected to the host 20, and performs processing in response to an access from the host 20. As described above, the memory card 1 has the NAND flash memory 3 and the controller 4.

The NAND flash memory 3 is a nonvolatile memory whose block size (erased block size) at the erasing time is set, for example, to 256 Kbytes. For example, data is written or read every 16 Kbytes. This NAND flash memory 3 is produced, for example, using a 0.09 μm process technology. That is, a design rule of the NAND flash memory 3 is set to be less than 0.1 μm.

In addition to the above-described CPU 8 and ROM 9, a memory interface section 5, a host interface section 6, a buffer 7, and a random access memory (RAM) 10 are mounted on the controller 4.

The memory interface section 5 performs interface processing between the controller 4 and the NAND flash memory 3. The host interface section 6 performs interface processing between the controller 4 and the host 20.

The buffer 7 temporarily stores a certain amount of data (e.g., for one page), when the data sent from the host 20 is written into the NAND flash memory 3, or temporarily stores a certain amount of data, when the data read from the NAND flash memory 3 is sent to the host 20.

The CPU 8 controls the whole operation of the memory card 1. For example, when the memory card 1 receives the power supply, the CPU 8 loads firmware (control program) stored in the ROM 9 into the RAM 10 to execute predetermined processing. That is, the CPU 8 prepares various types of tables in the RAM 10, receives a write command, a read command, or an erase command from the host 20 to access a corresponding region in the NAND flash memory 3, or controls data transfer through the buffer 7.

The ROM 9 is a memory in which the control program for use by the CPU 8 and the like are stored. The RAM 10 is a volatile memory which is used as a working area of the CPU 8 and which stores the control program or the tables.

Figure 4:
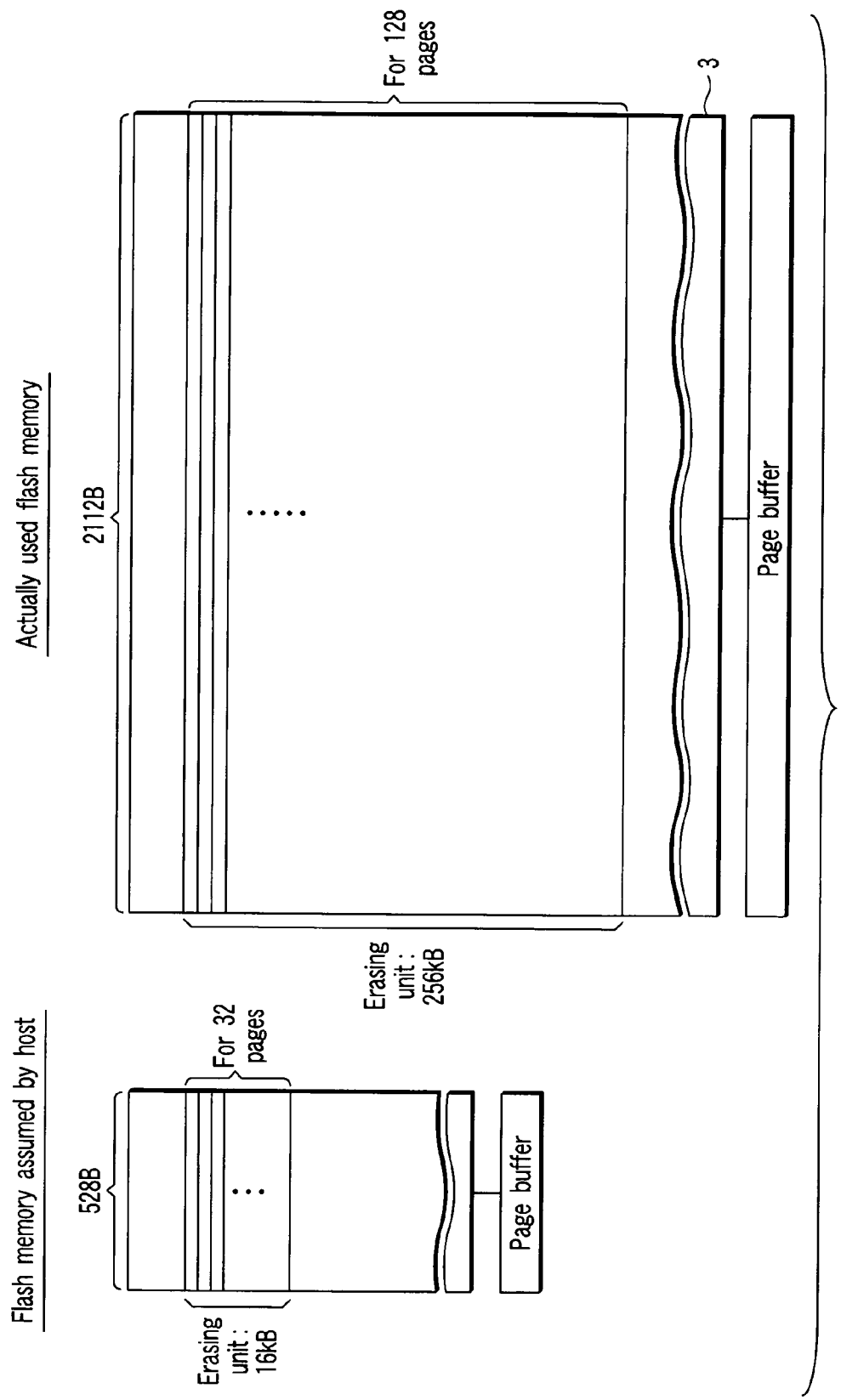
FIG. 4 is a diagram showing a relation between a flash memory assumed by the host apparatus and a flash memory for actual use.

FIG. 4 shows a difference of data arrangement between a flash memory assumed by the host 20 and a flash memory (i.e., the NAND flash memory 3 in the memory card 1) for actual use.

In the flash memory assumed by the host 20, each page has 528 bytes (data storage section for 512 bytes+redundant portion for 16 bytes), and 32 pages constitute one erasing unit (i.e., 16 Kbytes+0.5 Kbytes [here, K denotes 1024]). The card on which the flash memory is mounted will be hereinafter referred to as the "small block card" in some case.

On the other hand, in the flash memory 3 for actual use, each page has 2112 bytes (e.g., data storage section for 512 bytes×4+redundant portion for 10 bytes×4+management data storage section for 24 bytes), and 128 pages constitute one erasing unit (i.e., 256 Kbytes+8 Kbytes). The card on which the flash memory 3 is mounted will be hereinafter referred to as the "large block card" in some case. It is to be noted that in the following description, for convenience, the erasing unit of the small block card is referred to as 16 Kbytes, and that of the large block card is referred to as 256 Kbytes.

Moreover, each of the flash memory assumed by the host 20 and the flash memory for actual use is provided with a page buffer for inputting/outputting data with respect to the flash memory. A storage capacity of the page buffer disposed in the flash memory assumed by the host 20 is 528 bytes (512 bytes+16 bytes). On the other hand, the storage capacity of the page buffer disposed in the flash memory 3 for actual use is 2112 bytes (2048 bytes+64 bytes). During the writing of the data or the like, each page buffer executes the input/output of the data with respect to the flash memory every page, and this unit corresponds to its storage capacity.

In the example shown in FIG. 4, the erased block size of the flash memory 3 for actual use is 16 times that of the flash memory assumed by the host 20. However, the present embodiment is not limited to this example, and another magnification may be set as long as it is substantially an integer.

To form the large block card into a practically effective product, the storage capacity of the flash memory 3 shown in FIG. 4 is preferably 1 Gbit or more. For example, when the storage capacity of the flash memory 3 is 1 Gbit, the number of 256-Kbyte blocks (erasing unit) is 512.

Moreover, FIG. 4 shows a case where the erasing unit is a 256-Kbyte block, and it is practically effective to construct the erasing unit as a 128-Kbyte block. In this case, the number of 128-Kbyte blocks is 1024.

Furthermore, the example shown in FIG. 4 shows a case where the erased block size of the flash memory 3 for actual use is larger than that of the flash memory assumed by the host 20. However, the present embodiment is not limited to this example, and the erased block size of the flash memory 3 for actual use may be constituted to be smaller than that of the flash memory assumed by the host 20.

FIG. 5 is a diagram showing communication hierarchies of a host 20-side system and the memory card 1 (large block card).

The system on the host 20 side has an application software 21, a file system 22, a driver software 23, and a small block card physical access layer 24. On the other hand, the memory card 1 (large block card) has a small block card physical access layer 11, a small block card physical/small block card logical conversion layer 12, a small block card logical/large block card physical conversion layer 13, and a large block card physical access layer 14.

For example, when the application software 21 on the host 20 side requires the file system 22 to write a file, the file system 22 instructs the driver software 23 to perform sequential sector writing based on the logical block address of the small block card. In response to this, the driver software 23 realizes the sequential writing for each 16-Kbyte block based on the logical block address of the small block card. In this case, the driver software 23 converts a logical/physical block, issues to the large block card a random write command by the physical block address of the small block card through the small block card physical access layer 24, and transfers the data.

It is to be noted that in this write access, it is assumed in both of the small and large block cards that information is transmitted or received in order of (1) command, (2) page address (row address), (3) column address, (4) data, and (5) program confirmation command according to protocol.

On a large block card side, on receiving the write command by the physical block address of the small block card from the host 20, the small block card physical access layer 11 acquires the logical block address included in data accompanying the physical block address and the data.

The small block card physical/small block card logical conversion layer 12 has a first table for converting the physical block address (corresponding to the 16-Kbyte block) of the small block card into the logical block address (corresponding to the 16-Kbyte block) of the small block card during data reading or the like. When the small block card physical access layer 11 receives the write command to acquire the logical block address of the small block card, the conversion layer 12 reflects this in the first table. The layer 12 also reflects the physical block address in the first table.

The small block card logical/large block card physical conversion layer 13 has a second table for converting the logical block address (corresponding to sequential blocks as many as 16-Kbyte blocks×16) of the small block card into the physical block address (corresponding to a 256-Kbyte physical block) of the large block card during the data reading or the like. When the small block card physical access layer 11 receives the write command to acquire the logical block address of the small block card, the conversion layer 12 reflects this in the second table.

The large block card physical access layer 14 decides data arrangement inside the flash memory 3 based on the logical block address of the small block card acquired by the small block card physical access layer 11 which has received the write command. The layer sequentially writes data for 16 Kbytes every 2 Kbytes (1 page) in the 256-Kbyte physical block. The large block card physical access layer 14 stores the acquired logical or physical block address of the small block card in a predetermined region inside a management data region inside the flash memory 3.

Figures 6A, 6B:
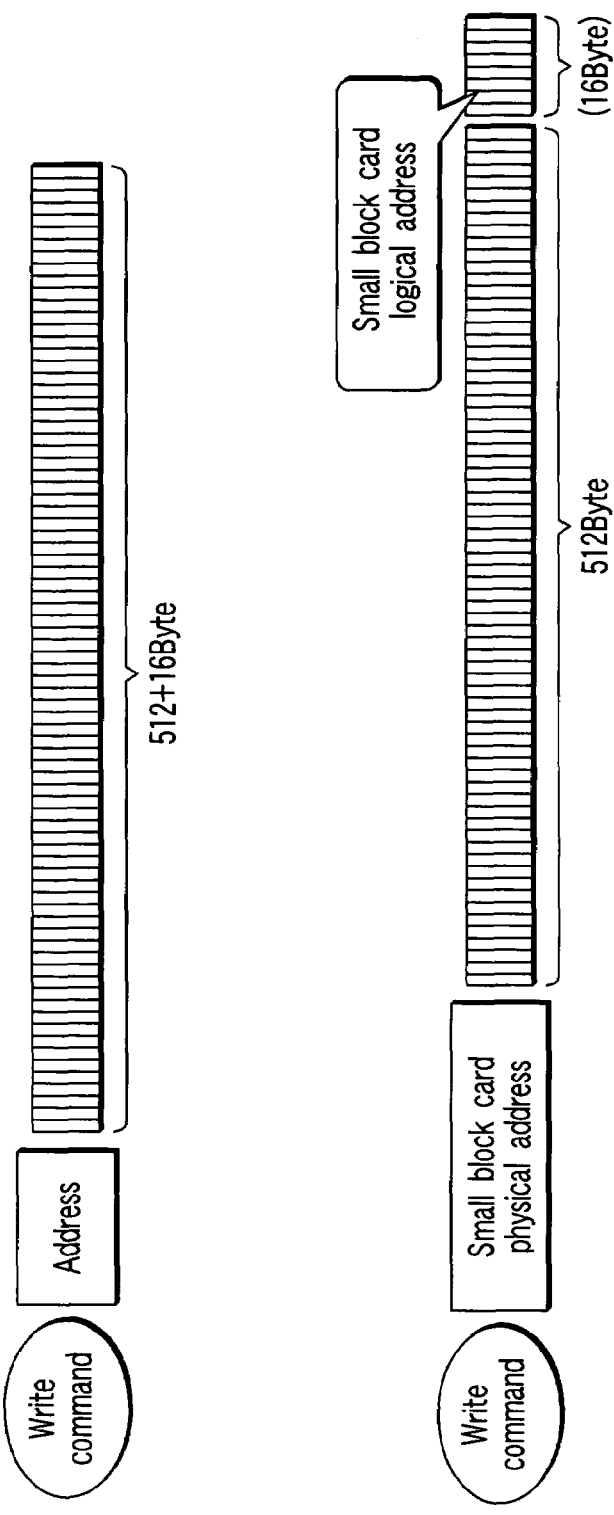
FIGS. 6A, 6B are diagrams showing formats of commands sent from a host side.

Since the host 20 issues the command based on the physical block address of the small block card in this manner, a large block card side manages the data in such a manner as to identify the 256-Kbyte physical block in which the data corresponding to the physical block address of the small block card exists. Specifically, correspondence of the logical/physical block address of the small block card is managed for each 16-Kbyte block, and the data is managed in such a manner as to identify the 256-Kbyte physical block in the large block card in which the data corresponding to the logical block addresses of continuous 256-Kbyte blocks of the small block card is stored FIGS. 6A and 6B are diagrams showing formats of the commands sent from the host 20 side. As shown in FIG. 6A, a packet of the command sent from the host 20 side include various types of information such as command type information (here, "write"), an address (physical block address), and data (actual data such as contents and accompanying data (512 bytes+16 bytes).

In this format of packet, as shown in FIG. 6B, the "logical block address" (logical address corresponding to the 16-Kbyte block which is an access object) of the small block card is disposed in a predetermined position in 16 bytes of the accompanying data. The large block card acquires especially the above-described "logical block address" in addition to the command type information, physical block address, and data. It is to be noted that this "logical block address" is not added in case of a read command.

Figure 7:
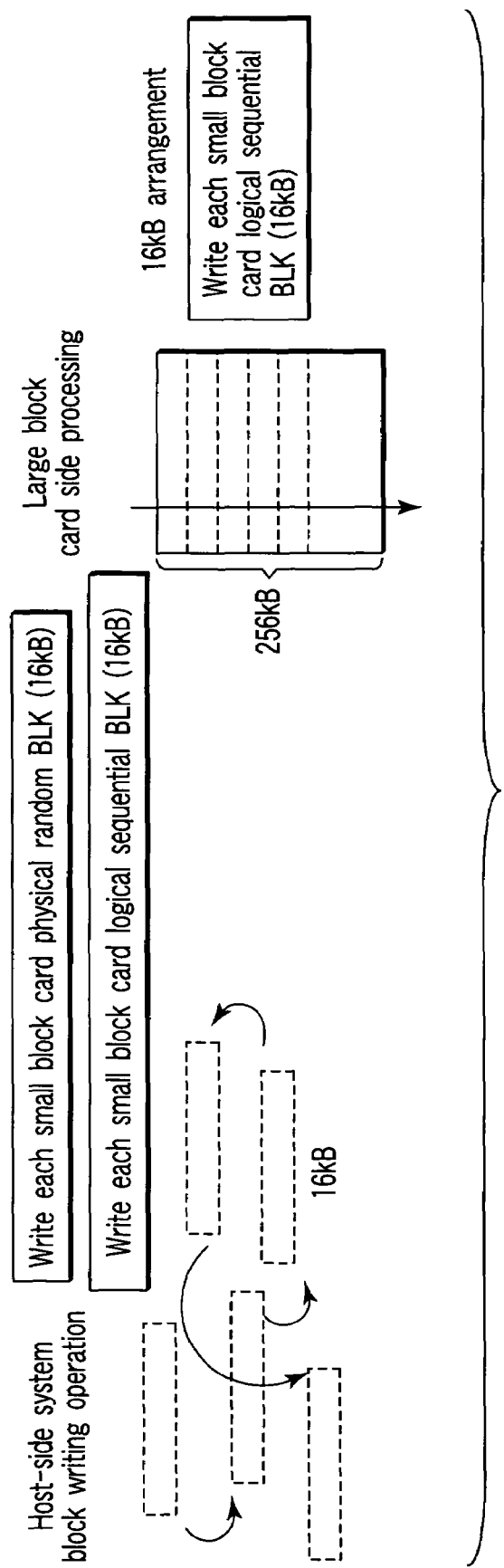
FIG. 7 is a diagram showing a block write operation assumed by the host side in comparison with writing actually performed on a memory card side.

FIG. 7 is a diagram showing a block write operation assumed by the host side in comparison with writing actually performed on a memory card 1 (large block card) side.

On the host 20 side (left side of the figure), at a time of generation of a sequential write operation for each 16-Kbyte block based on the logical address of the small block card, a random write operation is performed every 16-Kbyte block based on the physical block address of the small block card.

On the other hand, on a large block card side (right side of the figure), when the write command is received from the host 20 side, the data of each 16-Kbyte block based on the logical block address of the small block card is sequentially written into the flash memory 3.

As described above, the host 20 performs a random write operation every 16 bytes based on the physical address of the small block. In this random write operation, in general, processing for rewriting a part of a large block (256 Kbytes) only is generated many times. The data is only erased every block in the NAND flash memory. Therefore, in a case where a part of the block only is rewritten, new data to rewrite is written into a new erased block, and remaining data that cannot be rewritten needs to be copied to the new block from an old block including old data to be rewritten into new data. Thus, the processing for rewriting a part of the block only is accompanied by a copy operation (hereinafter referred to as "victim data copy") of the data that cannot be rewritten. Therefore, when the processing for rewriting a part of the block only occurs many times, overheads increase largely. To solve the problem, in the present embodiment, the physical address is again assigned on a large block card side following the order of the logical addresses obtained from the host 20 side. Accordingly, the occurrences of the writing of a part of the block only are reduced, and the increases of the overheads are reduced.

Figure 8:
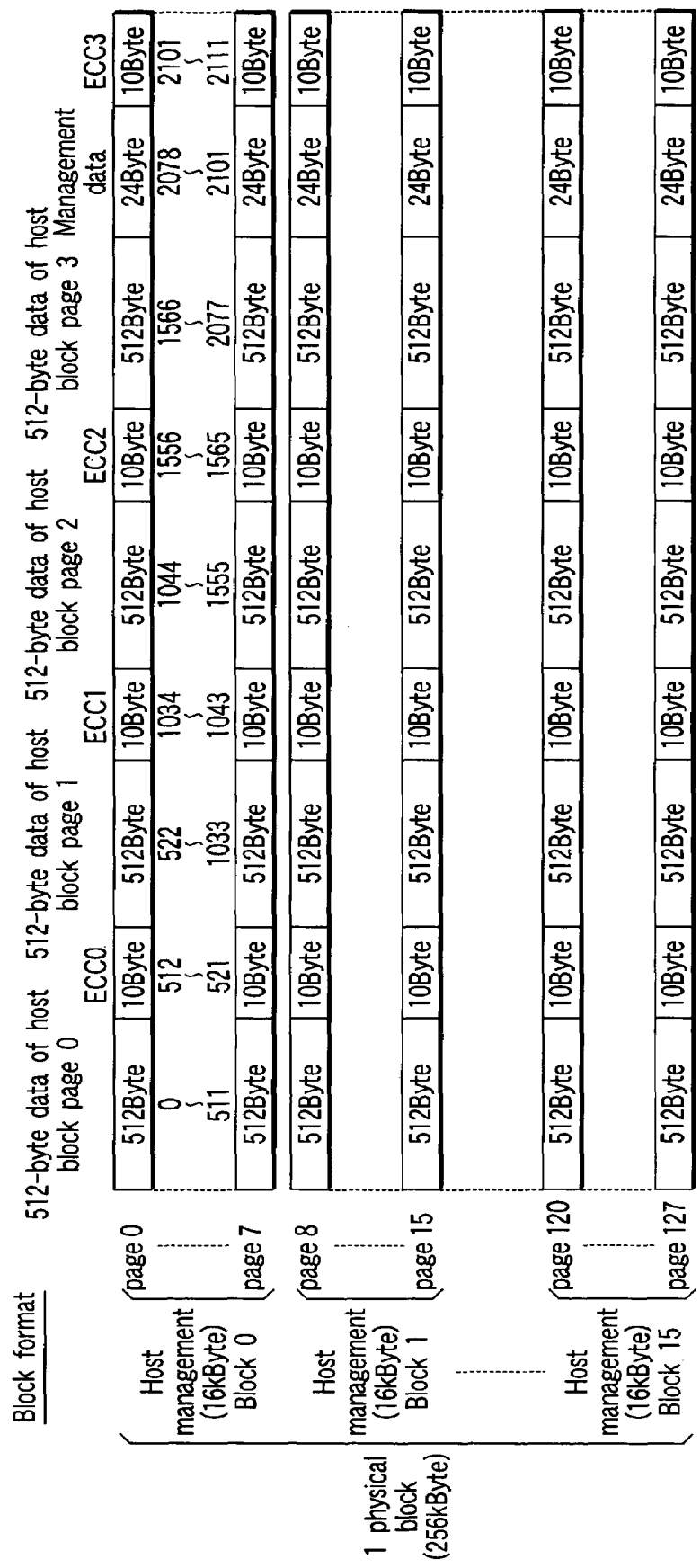
FIG. 8 is a diagram showing one example of a block format of a NAND flash memory in a large block card.

FIG. 8 shows one example of a block format (for the 256-Kbyte physical block which is an erasing unit) of the NAND flash memory 3 in the large block card.

In the large block card, the 256-Kbyte physical block which is the erasing unit includes 16 blocks (hereinafter referred to as the host management blocks) for writing data corresponding to 16 Kbytes as a unit which is managed on the host 20 side. During the data writing, individual data are arranged in order of the logical block address of the small block card.

Each host management block comprises eight pages. Each page includes four 512-byte data regions, and 10-byte ECC regions corresponding to the respective data regions. A 24-byte management data region is also disposed after the last 512-byte data region (fourth 512-byte data region) in the page. Therefore, the last 10-byte ECC region in the page is constitute in such a manner as to correspond to both of the fourth 512-byte data region and the 24-byte management data region.

Among 128 24-byte management data regions included in the 256-Kbyte physical block which is the erasing unit, for example, in the last 24-byte management data region, address information corresponding to the physical block address acquired from the command sent from the host 20 side, and address information corresponding to the logical block address are stored together. These address information are used in preparing the first table owned by the small block card physical/small block card logical conversion layer 12 and the second table owned by the small block card logical/large block card physical conversion layer 13 described with reference to FIG. 5.

Figure 9:
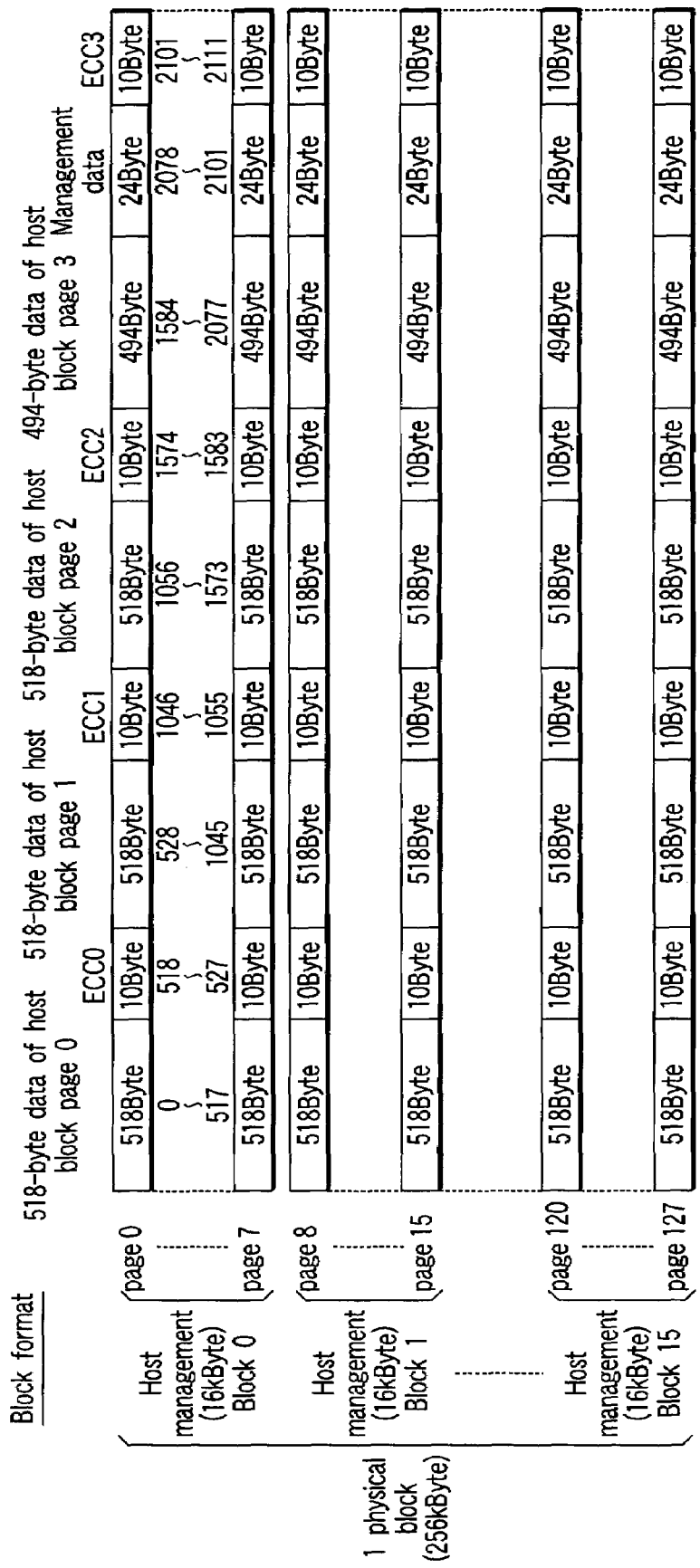
FIG. 9 is a diagram showing an example of a block format different from that of FIG. 8.

FIG. 9 is a diagram showing an example of a block format which is different from that of FIG. 8.

The block format shown in FIG. 9 is different from that of FIG. 8 in arrangement positions of regions ECC0, ECC1, ECC2 in each page. Additionally, the block format shown in FIG. 8 is the same as that shown in FIG. 9 in the storage capacity of user data in each page. That is, in the block format shown in FIG. 8, a storage region of 2048 bytes (512 bytes+512 bytes+512 bytes+512 bytes) is disposed in each page. In the block format shown in FIG. 9, a storage region of 2048 bytes (518 bytes+518 bytes+518 bytes+494 bytes) is disposed in each page. A case where the block format shown in FIG. 9 is employed is assumed and described hereinafter.

FIG. 10 is a timing chart showing an example of signals of an I/O pin and an R/B pin of the memory card 1 at a time when the data is written into the memory card 1 of the present embodiment by the host 20.

The host 20 controls the memory card assuming that the memory card is a nonvolatile memory having an erased block size of 16 Kbytes. For example, during the writing with respect to the memory card, the host 20 inputs a serial data input command 80H (H indicates hexadecimal) into the I/O pins 1 to 8. Next, the host 20 inputs a column address C/A and a page address P/A into the I/O pins 1 to 8. It is to be noted that here the column address C/A and the page address P/A are a column address and a page address in a virtual physical address space assumed by the host 20 with respect to the memory card 1.

Furthermore, the host 20 inputs write data into each of the I/O pins 1 to 8 528 times. Specifically, the host 20 successively shifts in data of 528 bits (528 bytes in total of all of the I/O pins) with respect to each I/O pin, while clocking an input signal into a write enable pin 528 times. When the shift-in of the data is completed, the host 20 inputs a program command 10H into the I/O pins 1 to 8. In response to this, the memory card outputs a low-level signal to the R/B pin, and indicates that the memory card is in a busy state. Thereafter, when a high-level signal is output to the R/B pin after a predetermined period, it is indicated that the memory card is brought into a ready state.

However, the state of the R/B pin in FIG. 10 persistently indicates the state of the memory card 1 with respect to the host 20. That is, in FIG. 10, even when the R/B pin indicates the busy state (i.e., outputs the low level) in response to the input of the program command 10H, the write operation (i.e., data transfer from the page buffer to a memory cell array) with respect to the NAND flash memory 3 is not necessarily actually performed inside the card. Even when the R/B pin returns to its ready state, the write operation with respect to the NAND flash memory 3 is not necessarily actually completed inside the card.

FIG. 11 is a timing chart showing an example of signals of the I/O pin and the R/B pin in the NAND flash memory 3 at a time when the data is written into the NAND flash memory 3 in the memory card 1 of the present embodiment by the controller 4 in the memory card 1.

The controller 4 recognizes that the NAND flash memory 3 is a nonvolatile memory having an erased block size of 256 Kbytes. For example, during the writing with respect to the NAND flash memory 3, the controller 4 inputs the serial data input command 80H into the I/O pins 1 to 8. Next, the controller 4 inputs the column address C/A and the page address P/A into the I/O pins 1 to 8. It is to be noted that here the column address C/A and the page address P/A are a column address and a page address in an actual physical address space assumed by the controller 4 with respect to the NAND flash memory 3. Therefore, the column address C/A and the page address P/A do not necessarily agree with those of FIG. 10.

Furthermore, the controller 4 inputs write data into each of the I/O pins 1 to 8 2112 times. Specifically, the controller 4 successively shifts in data of 2112 bits (2112 bytes in total of all of the I/O pins) with respect to each I/O pin, while clocking an input signal into a write enable pin 2112 times. When the shift-in of the data is completed, the controller 4 inputs the program command 10H into the I/O pins 1 to 8. In response to this, the memory card outputs the low-level signal to the R/B pin, and indicates that the memory card is in the busy state. Thereafter, when the high-level signal is output to the R/B pin after the predetermined period, it is indicated that the memory card is brought into the ready state. The state of the R/B pin in FIG. 11 indicates an actual state of the NAND flash memory 3 with respect to the controller 4.

It is to be noted that FIGS. 10 and 11 indicate the input to each of the column address C/A and the page address P/A in one cycle, but there are appropriately two or more cycles depending on the capacity of the memory card 1 or the NAND flash memory 3.

As seen from FIGS. 10 and 11, there is a restriction as to a time when the memory card is in the busy state. Therefore, for this time, the data is written, and after the predetermined period, it has to be indicated to the host side that the memory card is brought into the ready state.

In the following description, the physical block address and the logical block address in the flash memory assumed by the host 20 are abbreviated as "xPBA" and "xLBA", respectively, and the physical block address in the flash memory 3 is abbreviated as "PBA".

In the present embodiment, the data storage region of the flash memory assumed by the host 20 is divided into a plurality of zones, and each zone is numbered and managed. Specifically, a group of 1024 blocks corresponding to physical block addresses xPBA 1 to 1023 is defined as zone 0, a group of 1024 blocks corresponding to physical block addresses xPBA 1024 to 2047 is defined as zone 1, a group of 1024 blocks corresponding to physical block addresses xPBA 2048 to 3071 is defined as zone 2, . . . , and 1000 xLBA are associated with each zone. It is to be noted that the physical block address xPBA0 is associated with a block which stores a card information structure (CIS) (described later) concerning the memory card 1.

FIGS. 12A, 12B show schematic constitutions of a data block and a centralized management block in the flash memory 3.

The data block (for one physical block) shown in FIG. 12A comprises 128 data pages as shown also in FIG. 9. A plurality of data blocks exist in the flash memory 3, and are used for storing user data (data such as a document, a static image, and a dynamic image which are readable/writable by the user). It is to be noted that in a predetermined region, for example, in the last data page of each data block, information of xPBA and xLBA corresponding to the PBA of the data block ate stored, and utilized in preparing an address conversion table.

On the other hand, the centralized management block (for one physical block) shown in FIG. 12B comprises one card information structure (CIS) page and a plurality of management pages 0, 1, 2, 3, . . . . Only one centralized management block exists in the flash memory 3. This centralized management block is a special block in which various types of management information (basically, information which cannot be read/written freely by the user and which is used by the host or the controller at a starting time of the flash memory 3) concerning the flash memory 3 are stored together. This block is disposed in a region having the highest robustness among all physical regions. That is, the centralized management block is disposed in a region having the least ECC errors among all of the physical regions.

A CIS page in the centralized management block is a page for use, for example, in judging whether or not the flash memory 3 is formatted according to physical format specifications of a predetermined memory card. The management pages 0, 1, 2, 3, . . . are pages to store zone numbers (Zone No.) to which the individual data blocks belong or statuses concerning errors of the individual data blocks. Each management page is used for acquiring the PBA of the data block group corresponding to the zone designated beforehand as a table preparing object zone, and utilized in preparing the address conversion table.

Figure 13:
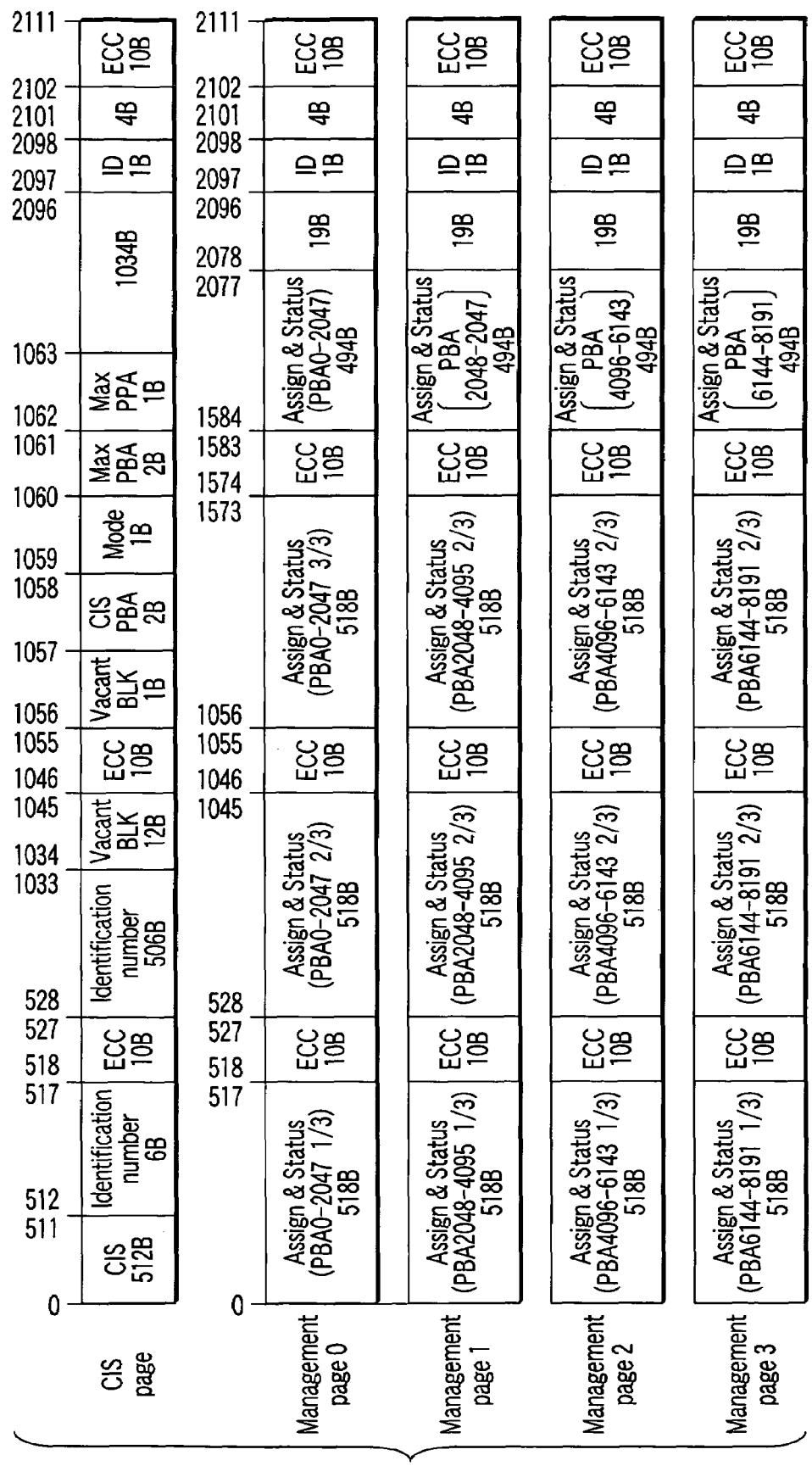
FIG. 13 is a diagram showing one example of the format of the centralized management block shown in FIG. 12B.
Figure 15:
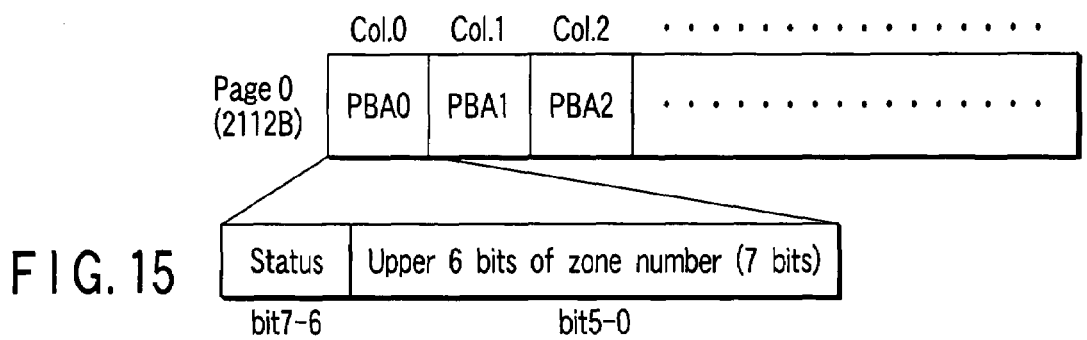
FIG. 15 is a diagram showing one example of the format of each column in management page 0 shown in FIG. 14.

FIG. 13 shows one example of the format of the centralized management block shown in FIG. 12. FIG. 14 integrates descriptions concerning major information shown in FIG. 13. FIG. 15 shows one example of the format of each column in management page 0 shown in FIG. 14. The CIS page and the management pages 0, 1, 2, 3, . . . will be described hereinafter in detail with reference to FIGS. 13 to 15.

In the CIS page of FIG. 13, there are various regions represented by "CIS", "CIS-PBA", "identification number", "ID", "vacant BLK", "ECC", "Mode", "Max PBA", "Max PPA", "1034B", "4B" and the like. The region "CIS" is a region to store card information structure data (CIS data) to be read by the host 20. The region "CIS-PBA" is a region to store the physical address (xPBA) indicating a storage position of the CIS data as viewed from the host 20 side (the physical address is stored so that the host 20 can handle a case where the CIS data is rewritten). The region "identification number" is a region to store the identification number of the memory card 1. The region "ID" is a region to store a type and a bad block attribute of the data written in the corresponding page. The region "vacant BLK" is a region to store the PBA of the vacant block whose data has been erased. The region "ECC" is a region to store an ECC corresponding to information of column addresses 0 to 517, an ECC corresponding to information of column addresses 528 to 1045, and an ECC corresponding to information of column addresses 1056 to 2101. The regions "Mode", "Max PBA", "Max PPA", "1034B", "4B" are regions to store various types of information for use at a debugging time (here detailed description is omitted).

On the other hand, in each of the management pages 0, 1, 2, 3, . . . in FIG. 13, there a plurality of regions represented by "Assign & Status", "ID", "ECC", "19B", "4B" and the like. The "Assign & Status" is a region to store the number (Zone No.) of a zone which is assigned to the data block, and the number of ECC errors existing in the data block for each data block. The region "ID" is a region to store a type and a bad block attribute of the data written in the page. The region "ECC" is a region to store an ECC corresponding to information of column addresses 0 to 517, an ECC corresponding to information of column addresses 528 to 1045, an ECC corresponding to information of column addresses 1056 to 1573, and an ECC corresponding to information of column addresses 1584 to 2101. The regions "19B" and "4B" are vacant regions (unused regions).

For example, when the management page 0 is noted among all of the management pages 0, 1, 2, 3, . . . , as shown in FIG. 15, there are disposed regions corresponding to PBA0, PBA1, PBA2, . . . which identify the individual data blocks in individual columns Col. 0, Col. 1, Col. 2, . . . constituting the management page 0, and a combination of the above-described zone number (Zone No.) (the above-described 6 bits among 7 bits) and status (Status) (2 bits) is stored in each region (for one byte).

Additionally, as described above, when uncorrectable errors are generated at a time of reading of the centralized management block, and the information of the centralized management block cannot be read, the centralized management block needs to be prepared anew. To solve the problem, all the blocks in the memory need to be scanned in order to obtain various types of information in the memory. However, there is a system in which a restricted time is disposed at the time of the starting of the system. When a scanning time is loner than this restricted time, a problem is generated that the system cannot be started.

For example, a system is assumed using a NAND flash memory in which one page has a size of (2048+64) bytes and one block comprises 128 pages and which is constituted of 8192 blocks in total. Assuming that information indicating positions of vacant blocks in the whole memory is written in the centralized management block in this system, in a case where the reading of the management information is impossible, all the 8192 blocks need to be scanned to check if there is any vacant block. Assuming that a time required for scanning one block is 100 μs, a time of about 820 ms is required in scanning all the blocks.

Supposing that the restricted time set at the time of the starting of the system is within 500 ms, it is difficult to read the management information of all the blocks within this restricted time. Therefore, it is impossible to start the system, when the reading of the management information becomes impossible. In this case, it is difficult to use the memory card, although most of the blocks are normal.

Figure 1:
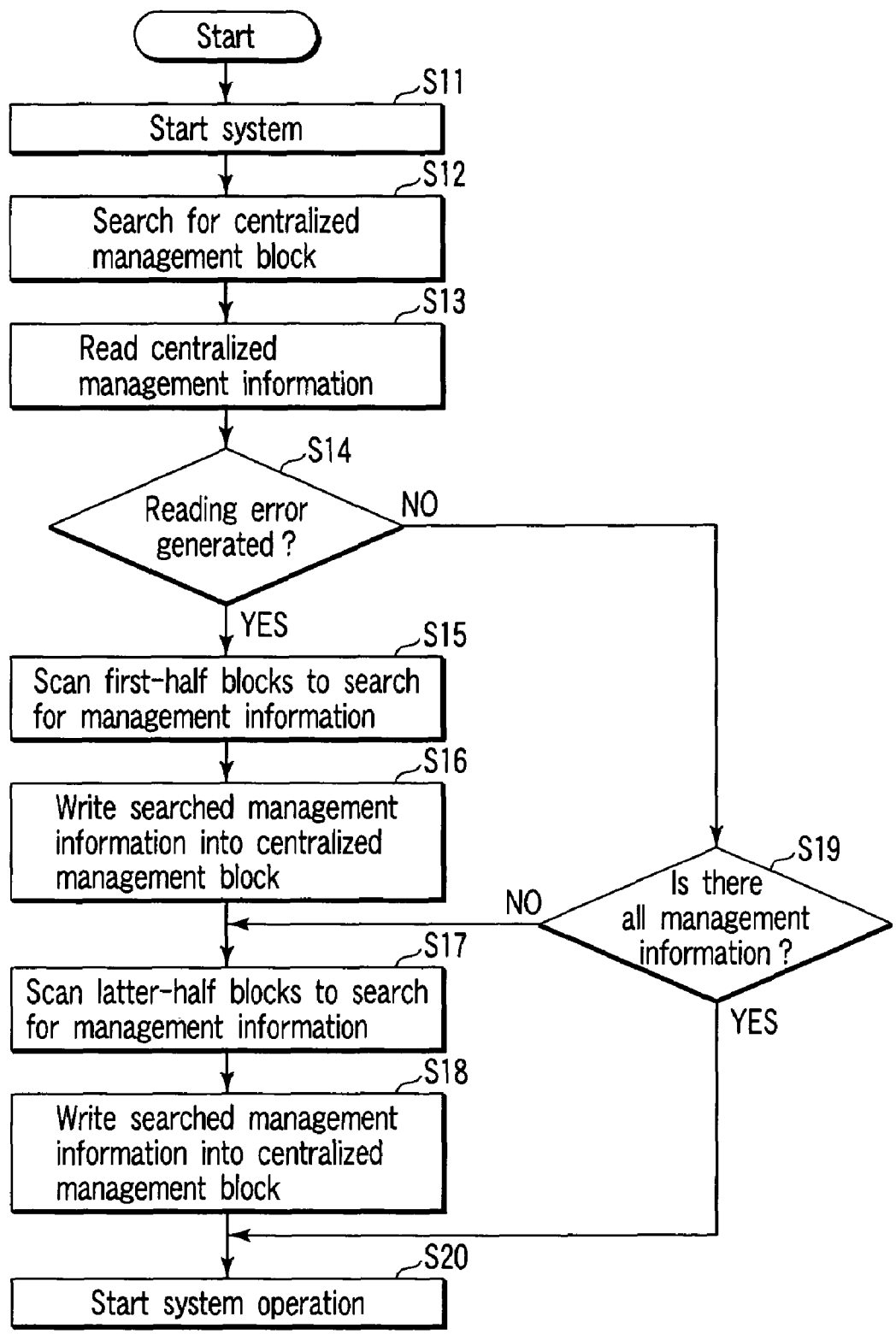
FIG. 1 is a flowchart showing an operation according to an embodiment.

To solve the problem, in the present embodiment, the management block is reconstructed by an operation shown in FIG. 1 to thereby enable the starting of the system. FIG. 1 shows an operation of the controller 4 of the memory card 1.

The operation at the time of the starting of the memory card will be described hereinafter with reference to FIG. 1.

As shown in FIG. 3, when the memory card 1 is attached to the host 20, and the memory card 1 is started by the host 20 (S11), the centralized management block in the flash memory 3 is detected (S12). This centralized management block is detected, for example, as follows.

Figure 16:
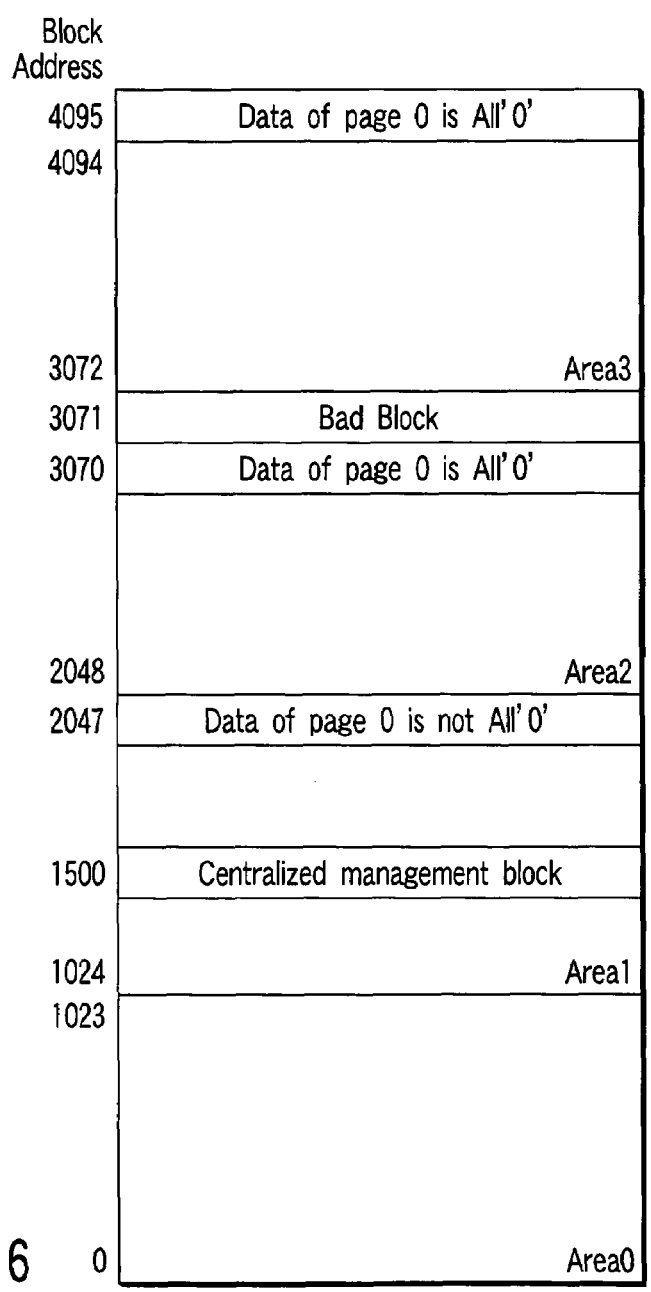
FIG. 16 is a diagram showing a position of the centralized management block.

As shown in FIG. 16, the storage region of the flash memory 3 is pre-formatted into a plurality of areas 0 to 3 at the time of shipping of a product. One area includes, for example, 1024 blocks. Each area has a data block (hereinafter referred to as the "marking block") including a specific page to store information indicating whether or not the centralized management block exists. That is, one marking block is disposed in each area. For example, when values of all columns constituting a specific page (page 0) are "0", any centralized management block does not exist in the area to which the specific page belongs. When there is even one column indicating a value of "1", it is defined that the centralized management block exists in the area to which the specific page belongs. In an example shown in FIG. 16, the centralized management block exists in Area 1.

When the centralized management block is searched for, the controller 4 searches the marking blocks included in the respective areas, and refers to the specific page included in each marking block to thereby search for the centralized management block.

When the centralized management block is detected, the information in the centralized management block is read (S13). It is judged at this reading time whether or not an uncorrectable error such as an ECC error has been generated (S14). As a result, when the error is generated, the centralized management block is reconstructed. That is, each block of the flash memory 3 is scanned, and the management information is read from each block. The read management information is held, for example, in the buffer 7 shown in FIG. 3. For example, in a case where the number of the blocks in the flash memory 3 is 8192, this operation is repeated as many times as 4096 blocks which are a half of the number (S15). When the management information is searched from the first-half block in the flash memory 3 in this manner, the management information held in the buffer 7 is written into the centralized management block of the flash memory 3 (S16).

Thereafter, the remaining 4096 blocks in the flash memory 3 are scanned to read the management information from these blocks (S17). The read management information is held in the buffer 7. When the management information is read from the latter-half 4096 blocks, the management information in the buffer 7 is written into the centralized management block of the flash memory 3 (S18).

Additionally, when a time reaches the restricted time set in the system during the scanning of the latter-half 4096 blocks, the starting is impossible. Thereafter, when the system is started again (S11), the centralized management block is searched for (S12), and centralized management information is read (S13). Thereafter, it is judged whether or not a reading error has been generated (S14). In this case, the data of the first-half 4096 blocks is already recorded in the centralized management block, and this recording ends normally. Therefore, any ECC error is not generated. Therefore, the control shifts to step S19 to judge whether or not the management information of all the blocks have been recorded in the centralized management block. In this case, since the only management information of the half of all the blocks are recorded, the control shifts to the step S17 to scan the remaining 4096 blocks and search the management information. The searched management information is stored in the buffer 7. When the searching is ended, the management information held in the buffer 7 is written into the centralized management block of the flash memory 3 (S18). In the latter-half scanning, the half of all the blocks may be scanned. Therefore, the latter-half management information can be searched within a range of the restricted time set in the system. Therefore, time-out during the latter-half scanning can be avoided.

Specifically, assuming that a time required for scanning one block is, for example, 100 μs, and the restricted time set at the starting time of the system is, for example, 500 ms, a time required for scanning 4096 blocks which is the half of 8192 blocks is about 410 ms. Therefore, the first and latter half block scanning is ended within the restricted time. Therefore, the time-out can be avoided.

Thus, the system can be started in a state in which the searched management information is written into the centralized management block, and the centralized management block is reconstructed (S20).

It is to be noted that in the above-described embodiment, a block scanning time is slightly shorter than the restricted time set in the system, and 4096 blocks, which is the half of all the blocks, are scanned in each of the first and latter halves. However, the present invention is not limited to this embodiment, and the number of blocks which are scanning objects may be reduced in accordance with the time required for scanning one block or the restricted time at the system starting time. For example, when the restricted time is set to the time required for scanning the blocks which are the half or less of all the blocks of the memory 3, the number of the blocks from which the management information can be read in one scanning operation is 4096 or less. Therefore, since the number of times for scanning all the blocks in the memory 3 increases, the number of restarting times increases until normal starting is achieved, but disabling of the restarting can be avoided.

According to the present embodiment, in a case where it is impossible to read the centralized management information at the system starting time, the blocks of the flash memory 3 are scanned to read the management information, and the read management information is written into the centralized management block within the restricted time set in the system. Even in a case where the reading of the centralized management information is impossible, when the system is restarted several times to search for the management information of each block, and the information is written into the centralized management block, the centralized management information can be restored, and the disabling of the restarting of the system can be avoided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A memory card comprising:
   a memory having a plurality of blocks including management information, and a centralized management block in which the management information of the respective blocks is centralized; and
   a control section configured to detect the centralized management block in the memory at a starting time, wherein when the centralized management block includes an error, the control section searches for the management information from the plurality of blocks in the memory and writes the searched management information into the centralized management block of the memory, within a restricted time set in a system.

2. The memory card according to claim 1, further comprising:
   a buffer which stores a plurality of pieces of information, wherein the control section detects the management information from the plurality of blocks in the memory and stores the management information in the buffer during a time which is shorter than the restricted time, and the control section writes the plurality of pieces of management information stored in the buffer into the centralized management block in the memory.

3. The memory card according to claim 1, wherein when the management information of all of the blocks is not recorded in the centralized management block at the starting time, the control section searches for the management information from the remaining blocks in the memory and stores the management information in the buffer during a time which is shorter than the restricted time, and the control section writes the plurality of pieces of management information stored in the buffer into the centralized management block in the memory.

4. The memory card according to claim 1, wherein the centralized management block includes first information indicating whether or not the block is normal.

5. The memory card according to claim 1, wherein the restricted time is set to a half or more of a time required in scanning all of the blocks of the memory, and the control section scans a half of the blocks of the memory in a case where the centralized management block includes the error.

6. The memory card according to claim 1, wherein the restricted time is set to a half or less of a time required in scanning all of the blocks of the memory, and the control section scans a half or less of all of the blocks of the memory in a case where the centralized management block includes the error.

7. The memory card according to claim 1, wherein the error is an uncorrectable error.

8. The memory card according to claim 1, wherein the memory is a NAND flash memory.

9. A method of controlling a memory card, comprising:
detecting a centralized management block in a memory at a starting time;
searching for management information from a plurality of blocks in the memory within a restricted time set in a system in a case where the centralized management block includes an error; and
writing the searched management information into the centralized management block of the memory.

10. The method according to claim 9, wherein the management information is detected from the plurality of blocks in the memory and is stored in a buffer during a time which is shorter than the restricted time, and the plurality of pieces of management information stored in the buffer are written into the centralized management block in the memory.

11. The method according to claim 9, wherein when the management information of all of the blocks is not recorded in the centralized management block at the starting time, the management information is searched from the remaining blocks in the memory to store the management information in a buffer during a time which is shorter than the restricted time, and the plurality of pieces of management information stored in the buffer are written into the centralized management block in the memory.

12. The method according to claim 9, wherein the restricted time is set to a half or more of a time required in scanning all of the blocks of the memory, and the control section scans a half of the blocks of the memory in a case where the centralized management block includes the error.

13. The method according to claim 9, wherein the restricted time is set to a half or less of a time required in scanning all of the blocks of the memory, and the control section scans a half or less of all of the blocks of the memory in a case where the centralized management block includes the error.

14. The method according to claim 9, wherein the centralized management block includes first information indicating whether or not the block is normal.

15. The method according to claim 9, wherein the error is an uncorrectable error.

16. A method of controlling a memory card, comprising:
detecting a centralized management block in a memory at a starting time;
searching for management information from a plurality of blocks in the memory within a restricted time set in a system in a case where the detected centralized management block includes an error;
writing the searched management information into the centralized management block of the memory;
judging whether or not the management information of all of the blocks is recorded in the centralized management block in a case where the detected centralized management block does not include any error; and
searching for the management information from the remaining blocks of the memory, and writing the plurality of pieces of searched management information into the centralized management block in the memory for a time which is shorter than the restricted time in a case where the management information of all of the blocks is not recorded.

17. The method according to claim 16, wherein the restricted time is set to a half or more of a time required in scanning all of the blocks of the memory, and the control section scans a half of the blocks of the memory in a case where the centralized management block includes the error.

18. The method according to claim 16, wherein the restricted time is set to a half or less of a time required in scanning all of the blocks of the memory, and the control section scans a half or less of all of the blocks of the memory in a case where the centralized management block includes the error.

19. The method according to claim 16, wherein the centralized management block includes first information indicating whether or not the block is normal.

20. The method according to claim 16, wherein the error is an uncorrectable error.

* * * * *